United States Patent
Simor et al.

(10) Patent No.: US 10,438,776 B2
(45) Date of Patent: Oct. 8, 2019

(54) ELECTRODE ASSEMBLY FOR A DIELECTRIC BARRIER DISCHARGE PLASMA SOURCE AND METHOD OF MANUFACTURING SUCH AN ELECTRODE ASSEMBLY

(71) Applicant: Nederlandse Organisatie voor toegepast-natuurwetenschappelijk onderzoek TNO, 's-Gravenhage (NL)

(72) Inventors: Marcel Simor, 's-Gravenhage (NL); André Schilt, 's-Gravenhage (NL)

(73) Assignee: Nederlandse Organisatie voor toegepast-natuurwetenschappelijk onderzoek TNO, 's-Gravenhage (NL)

( * ) Notice: Subject to any disclaimer, the term of this patent is extended or adjusted under 35 U.S.C. 154(b) by 0 days.

(21) Appl. No.: 15/744,608

(22) PCT Filed: Jul. 15, 2016

(86) PCT No.: PCT/NL2016/050526
§ 371 (c)(1),
(2) Date: Jan. 12, 2018

(87) PCT Pub. No.: WO2017/010885
PCT Pub. Date: Jan. 19, 2017

(65) Prior Publication Data
US 2018/0211817 A1    Jul. 26, 2018

(30) Foreign Application Priority Data
Jul. 15, 2015  (EP) ..................... 15176918

(51) Int. Cl.
*H01J 37/32*    (2006.01)
*H01J 9/02*    (2006.01)
(Continued)

(52) U.S. Cl.
CPC .......... *H01J 37/3255* (2013.01); *C23C 24/10* (2013.01); *H01J 9/02* (2013.01);
(Continued)

(58) Field of Classification Search
None
See application file for complete search history.

(56) References Cited

U.S. PATENT DOCUMENTS

| 5,407,639 A | 4/1995 | Watanabe et al. |
| 6,040,055 A | 3/2000 | Baba et al. |

(Continued)

FOREIGN PATENT DOCUMENTS

| CN | 1513753 A | 7/2004 |
| EP | 1383359 A2 | 1/2004 |

(Continued)

OTHER PUBLICATIONS

Ulrich Kogelschatz, "Dielectric-barrier Discharges: Their History, Discharge Physics, and Industrial Applications", Plasma Chemistry and Plasma Processing, vol. 23, No. 1, Mar. 2003.

(Continued)

*Primary Examiner* — Ashok Patel
(74) *Attorney, Agent, or Firm* — Banner & Witcoff, Ltd.

(57) ABSTRACT

An electrode assembly for use in a dielectric barrier discharge plasma source comprises a base metal plate, an enamel layer on a surface of the base metal plate and embedded electrodes embedded in the enamel layer. The electrode assembly may be made by depositing a one or more layers of powdered glass over a surface of the base metal plate, fusing the powdered glass the one or more layers each in a separate heating step for the relevant layer. To form the embedded electrodes, a pattern of electrode material is provided over the powdered glass of the one or more layers after fusing the one or more layers. Subse- (Continued)

quently one or more further layers of powdered glass are deposited over the electrodes and the layer(s) below it, and the powdered glass in each of the one or more further layers is fused in a separate heating step.

13 Claims, 3 Drawing Sheets

(51) Int. Cl.
    *H01J 9/50* (2006.01)
    *H05H 1/24* (2006.01)
    *C23C 24/10* (2006.01)
    *C23D 5/04* (2006.01)

(52) U.S. Cl.
    CPC .......... *H01J 9/50* (2013.01); *H01J 37/32348* (2013.01); *H01J 37/32541* (2013.01); *H01J 37/32596* (2013.01); *H05H 1/2406* (2013.01); *C23D 5/04* (2013.01); *H01J 2209/012* (2013.01); *H05H 2001/2418* (2013.01); *Y02W 30/828* (2015.05)

(56) References Cited

U.S. PATENT DOCUMENTS

| | | | |
|---|---|---|---|
| 6,938,409 | B2 | 9/2005 | Birckigt et al. |
| 2003/0024804 | A1 | 2/2003 | Hammer |
| 2004/0046490 | A1* | 3/2004 | Doll ................ H01J 61/545 313/485 |
| 2005/0093443 | A1* | 5/2005 | Pelletier 1 ................ H01J 11/12 313/582 |
| 2008/0210004 | A1* | 9/2008 | Gerding ............... G01F 23/284 73/304 C |
| 2015/0371829 | A1* | 12/2015 | Koyama .............. H05H 1/2406 313/231.31 |

FOREIGN PATENT DOCUMENTS

| | | |
|---|---|---|
| EP | 2205049 A1 | 7/2010 |
| JP | H0676915 A | 3/1994 |
| JP | 2000072413 A | 3/2000 |
| JP | 2004103423 A | 4/2004 |
| RU | 2184697 C2 | 7/2002 |
| SG | 174253 A1 | 10/2011 |
| WO | 2000/03956 A1 | 1/2000 |
| WO | 2003056597 A1 | 7/2003 |
| WO | 2005062338 A1 | 7/2005 |
| WO | 2009098662 A1 | 8/2009 |
| WO | 2010077138 A1 | 7/2010 |

OTHER PUBLICATIONS

Jose L. Lopez, "Dielectric Barrier Discharge, Ozone Generation, and their Applications", Complex Plasmas Summer Institute 2008.
Sep. 28, 2016—International Search Report and Written Opinion of PCT/NL2016/050526.
A. Chirikov et al, "Atmospheric pressure plasma of dielectric barrier discharges" Pure Appl. Chem., vol. 77 pp. 487-495 (2005).

* cited by examiner

ELECTRODE ASSEMBLY FOR A DIELECTRIC BARRIER DISCHARGE PLASMA SOURCE AND METHOD OF MANUFACTURING SUCH AN ELECTRODE ASSEMBLY

CROSS-REFERENCE TO RELATED APPLICATIONS

This application is a U.S. National Stage application under 35 U.S.C. § 371 of International Application PCT/NL2016/050526 (published as WO 2017/010885 A1), filed Jul. 15, 2016 which claims the benefit of priority to Application EP 15176918.9, filed Jul. 15, 2015. Benefit of the filing date of each of these prior applications is hereby claimed. Each of these prior applications is hereby incorporated by reference in its entirety.

FIELD OF THE INVENTION

The invention relates to an electrode assembly for a dielectric barrier discharge (DBD) plasma source and a DBD plasma source comprising such an electrode assembly. The invention also relates to a method of manufacturing such an electrode assembly.

BACKGROUND

In dielectric barrier discharge plasma sources plasma is generated at the surface of a dielectric layer. Electrodes are used to generate a high frequency electric field with a component normal to that surface, which gives rise to ionization of gas present at the surface of the dielectric layer thus generating the plasma.

There are a number of different types of DBD plasma sources. In the conventional configuration shown in FIG. 1a, the electric field is generated between a first electrode 10 and second electrode 12 with surfaces that face each other. A dielectric layer 14 is provided on the surface of at least one of the electrodes, leaving a gas filled gap 16 between the dielectric layer and the other electrode. This type of DBD plasma source is called "volume" DBD plasma source, because the plasma is created in the volume of the gap.

An article titled "Atmospheric pressure plasma of dielectric barrier discharges" by A. Chirikov et g, published in Pure Appl. Chem., vol 77 pp 487-495 (2005) discusses a plasma source of this type and discusses its basic physics. The article by Chirikov et al gives glass, quartz, ceramics and polymer as examples of dielectrics, and more specifically a steel tube coated with enamel.

Electric breakdown of the dielectric layer can result in damage to the plasma source and to malfunction. Superficial local damage may reduce functionality even if it does not lead to complete failure. The susceptibility of the dielectric layer is conventionally characterized by its nominal electric breakdown field strength. For an ideal dielectric layers breakdown is avoided if the electric field in the plasma source is kept below the nominal electric breakdown field strength of the dielectric layer. At the same time use in a plasma source defines a minimum needed value of the electric field: the electric field should be sufficiently high not only to excite the plasma, but also to ensure full coverage of the surface of the dielectric layer.

The dielectric material must be chosen to ensure that the nominal electric breakdown field strength exceeds the minimum needed value of the electric field. In reality, however imperfections of the dielectric layer and dynamic effects give rise to a risk of breakdown even if the nominal electric breakdown field strength is sufficiently high. A safety margin is needed to achieve a reasonable expected operational lifetime of the plasma source.

Additionally, if the electric field strength varies as a function of position, the nominal electric breakdown field strength needs to exceed the minimum needed value at the positions where the electric field is highest. This is not an issue in the volume DBD plasma source of FIG. 1a, because the electric field between flat plates is uniform and equal to its average value.

However, in plasma sources wherein the field strength varies with position a higher demand is placed on the electric breakdown field strength of the dielectric material. A dielectric material that is sufficient for a uniform volume DBD plasma source need not be sufficient for such a plasma source. For example, the demands on the breakdown voltage increase significantly when a plurality of embedded electrodes is present in the dielectric layer, which make the electric field strength vary as a function of position. Surface DBD plasma sources are examples of plasma sources with such embedded electrodes.

FIG. 1b, illustrates an example of a surface DBD plasma source. Herein a first and second electrode 10, 12 are provided on opposite surfaces of the same dielectric layer 16. In this configuration, the gas-exposed surface of the dielectric layer 16 is not fully covered by the electrode 12 (or electrodes) at that surface. In such a structure, the electric field lines from the electrode 12 on the gas-exposed surface will run not only directly between the electrodes through the dielectric layer 16, but also along bent field lines, first through the gas space adjacent the dielectric layer 16 and from that gas space into the uncovered part of the surface of the dielectric layer 16. This gives rise to plasma on the gas-exposed surface, mostly along the edges of the electrode (s). Because no gas gap between the electrodes is involved, this type of plasma source is referred to as a surface DBD plasma source. Electric breakdown of the dielectric layer should be prevented everywhere, by using dielectric material with a breakdown strength that exceeds the highest electric fields in the structure, especially at and near the surface of the dielectric layer. This places a higher demand on the dielectric layer.

Breakdown can become more critical in another type of surface DBD plasma source, shown in FIG. 1c, wherein at least one of the electrodes is embedded in the dielectric layer. In such a configuration there are bent electric field lines that first run upwards from the embedded electrode(s), emerging from the gas-exposed surface of the dielectric layer 16 and elsewhere down back into the gas-exposed surface to another electrode. In such a configuration, the dielectric layer 16 needs to be very thin to ensure that sufficient electric field strength arises at the gas exposed surface of the dielectric layer 16.

A surface DBD plasma source of this type with embedded electrodes is disclosed in WO2010077138. This document mentions a ceramic coating as an example of a dielectric coating. The document mentions problems with reduced operational lifetime due to breakdown. This problem is addressed by switching off sections of the source that have become useless as a result of electric breakdown.

A plasma display that uses buried electrodes is disclosed in WO00/03956. The display has a front and back panel, between which plasma is excited at individual pixels. The back panel contains a buried electrode. Electrodes are provided in green tape (a flexible pre-fired ceramic) after application of bonding glaze to the metal core for bonding the core to the green tape. The bonding core is made by firing a glass-powder suspension at 550 centigrade. The structure is embossed to create ribs between different pixels and fired at 900 centigrade.

In practice, the manufacture of surface DBD plasma sources with large continuous areas of plasma has proved to be far more difficult than for volume DBD plasma sources. For example, manufacture is usually starts from a ceramic plate and applies electrodes to that plate. In this case, the ceramic plate needs to be thin (e.g. at most one or less than a few mm thick, e.g. up to 1.5 mm). Due to the brittleness of ceramics, this limits the size of the plates that can be used. Another problem with large thin layer can be mismatch of thermal expansion coefficients of different layers. As a result, the size of commercial surface DBD plasma sources have remained limited to substantially less than a meter, even if thermal expansion problems are reduced by cooling. For example, an oil bath may be used to cool an external electrode on the dielectric layer.

SUMMARY

Among others, it is an object to provide for a DBD plasma source that can be manufactured at a significantly larger size.

An electrode assembly for a dielectric barrier discharge plasma source is provided, comprising a base metal plate; an enamel layer on a surface of the base metal plate; and embedded electrodes embedded in the enamel layer. In an embodiment, the enamel layer has a thickness of less than one millimeter, e.g. between 0.2 to 0.8 mm and the base metal plate is thicker e.g. between 1-10 millimeter, optionally with channels for cooling liquid in the base metal plate. By using enamel as a dielectric is possible to make large sized DBD plasma generating structures, for example structures wherein the plasma generating surface extends over more than one meter. In an embodiment, metal plate forms a wall of a cylinder, which may have a correspondingly large diameter so that a foil with a surface to be treated can easily be fed over the cylinder. In other embodiments the metal plate may form flat plate that may have a large width and or length e.g. of more than one meter. A dielectric barrier discharge plasma source is provided that contains such an electrode assembly. The dielectric barrier discharge plasma source may be a surface dielectric barrier discharge plasma source, or a volume dielectric barrier discharge plasma source, wherein an additional electrode (optionally covered by a dielectric) may be present above the surface of the enamel layer, leaving a volume for the plasma above the surface of the enamel layer. The dielectric barrier discharge plasma source may be used for example to provide a plasma in a large area or to create a plasma jet from gas that flows over the surface of the enamel layer.

According to another aspect, a method of manufacturing an electrode assembly for a dielectric barrier discharge plasma source is provided, the method comprising
  depositing a first layer of powdered glass over a surface of base metal plate;
  fusing the powdered glass in the first layer by heating;
  providing a pattern of electrode material over the powdered glass of the first layer after said fusing;
  depositing a second layer of powdered glass over the first layer and the pattern of electrode material;
  fusing the powdered glass in the second layer by heating.
The pattern of electrode material provides for the embedded electrodes. In this way an enamel layer with embedded electrodes is realized. The pattern of electrode material may define successive, mutually separate strips of electrode material or a honeycomb pattern for example. In an embodiment, the method comprises successively depositing a plurality of second layers of powdered glass on top of each other over the first layer and the pattern of electrode material, and fusing each one of the plurality of second layers of powdered glass by heating before depositing a next one of the second layers of powdered glass. By successively fusing successive thin layers one after the other, the electric breakdown strength of the enamel is increased at least in the regions where it is most critical, near the plasma generating surface. Fewer air inclusions remain that can give rise to locally increased susceptibility to electric breakdown. Electric breakdown strength measurements of the enamel obtained by successively fusing successive thin layers one after the other show that such a layer has different properties compared to an enamel layer that has been created in one step, which is indicative of enamel with fewer air inclusions.

The enamel layer above the level of the embedded electrodes may be made in steps of smaller thickness than layers below the level of the embedded electrodes. The latter are less critical for electric breakdown and may be manufactured more quickly by using a single thick layer or a plurality of layers that includes a thicker layer. In an embodiment the enamel below the electrodes may also be fused in successive steps to increase the breakdown field strength.

In a further embodiment a combined thickness of the plurality of second layers is at least a hundred micrometers after fusing. At least a topmost one of the plurality of second layers may have a thickness in a range of ten to fifty micrometers after fusing, and more preferably in a range of twenty to forty micrometers. Preferably, each of the plurality of second layers has a thickness in a range of ten to fifty micrometers after fusing.

According to another aspect, a method of repairing an electrode assembly for a dielectric barrier discharge plasma source of this type. The method of comparing comprises filling a defect in a surface of the enamel layer with powdered glass of the same composition with which the enamel layer was originally formed and heating the powdered glass to a temperature where the powdered glass flows. Optionally, if the defect has laid bare an electrode and the electrode is damaged, the electrode may be repaired as well by depositing electrode material before filling the defect with glass powder.

BRIEF DESCRIPTION OF THE DRAWINGS

These and other objects and advantageous aspects will become apparent from a description of exemplary embodiments with reference to the following figures.

DETAILED DESCRIPTION OF EXEMPLARY EMBODIMENTS

Figure 2:
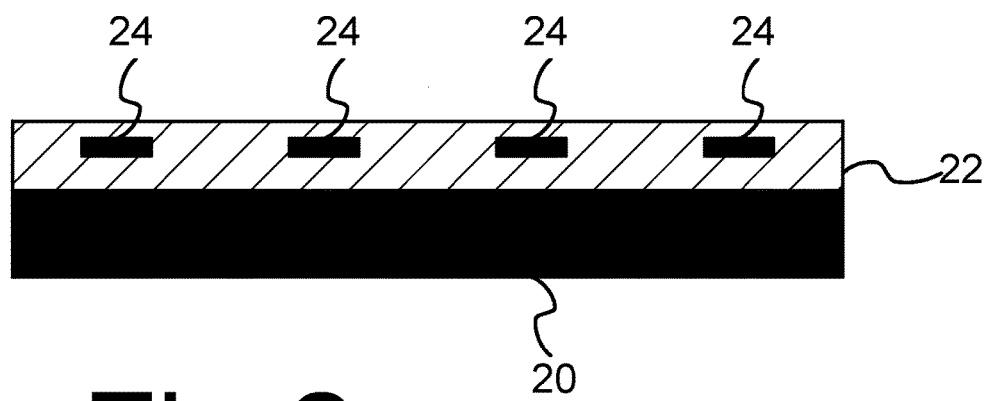
FIG. 2 shows a cross-section of a surface DBD plasma generation electrode assembly.

FIG. 2 shows a cross-section of a surface DBD plasma generation electrode assembly in side view. The electrode assembly comprises a metal base plate 20, an enamel layer 22 and electrodes 24 embedded in enamel layer 22. Overall, metal base plate 20 may be a flat plate or it may form any other shape, e.g. a cylinder or L-profile. At the scale of the figure, such a metal base plate 20 is substantially flat irrespective of its shape. Enamel layer 22 serves as dielectric layer. In the illustrated embodiment, the entire dielectric between metal base plate 20 and embedded electrodes 24 and above embedded electrodes 24 is of enamel. Preferably, at least the part of the dielectric that is in contact with embedded electrodes 24, surrounds it and extends to the upper surface is entirely of enamel. The thickness of the various layers is not to scale. Metal base plate 20 may have any thickness (e.g. 1-10 mm). In an embodiment, metal base plate 20 comprises channels for cooling fluid.

The enamel layer 22 may have a thickness in a range of 0.2 to 0.8 mm for example. Electrodes 24 may be thick film electrodes, with a thickness in a range of 5 to 10 micrometer for example. Although not shown in the cross section, electrodes 24 are exposed at least at some locations of the source in order to apply voltages, e.g. through vias.

Figure 1A:
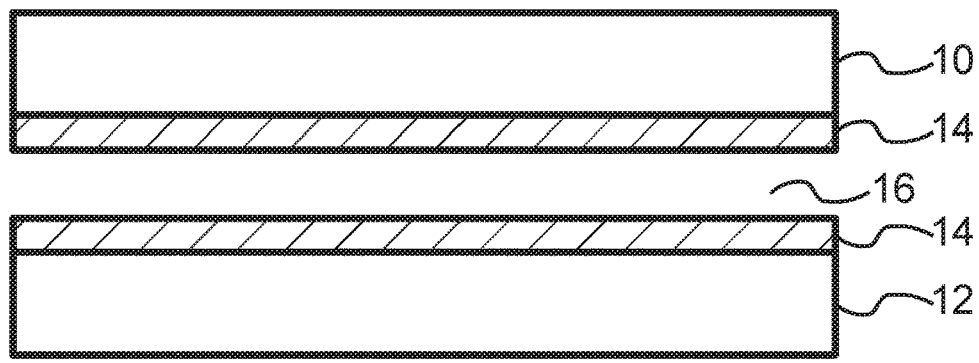
FIG. 1a-c show plasma generation structures.
Figure 1B:
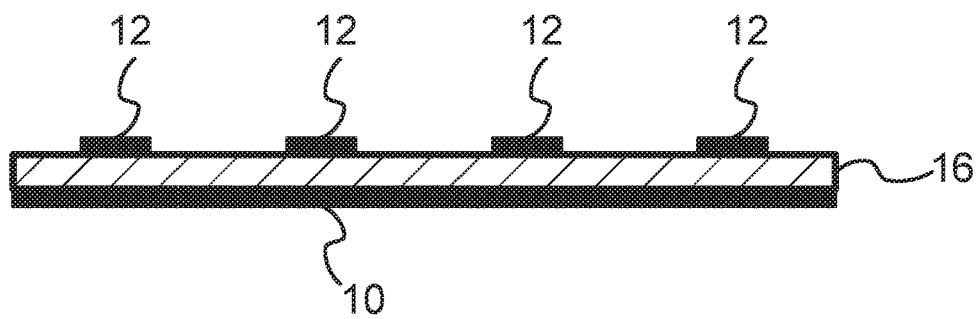
Figure 1C:
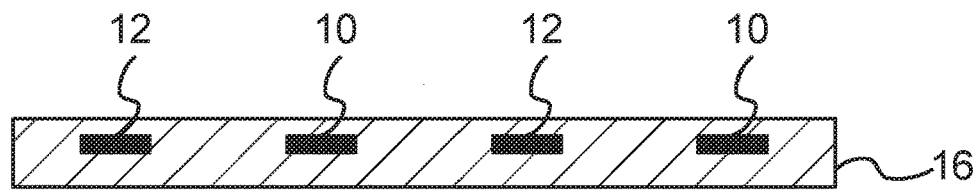
Figure 2A:
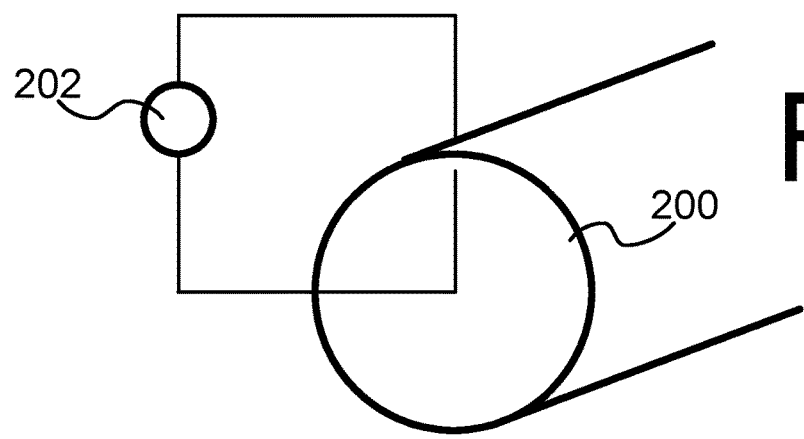
FIG. 2a illustrates a plasma source.

FIG. 2a illustrates a plasma source, comprising the surface DBD plasma generation electrode assembly of FIG. 1 and a pulsed high voltage source 202 coupled between the embedded electrodes and the metal base plate. In the illustrated embodiment, surface DBD plasma generation electrode assembly (indicated by 200) has a cylindrical shape, wherein the base metal plate forms a wall of the cylinder with the enamel layer and the embedded electrodes radially on the outside of the wall. The plasma source may furthermore comprise a cooling system (not shown) coupled to metal base plate 20, such as an oil bath, a system of conduits for cooling liquid etc. The enamel layer results in a higher cooling efficiency and robustness compared to use of a conventional ceramic or quartz or borosilicate glass plate. Because of its ease of manufacturing it enables manufacture of a plasma source wherein the plasma generation surface extends along more than one meter. In the illustrated example of a cylinder, the perimeter of the cylinder and/or its axial length may be more than one meter.

In operation, pulsed high voltage source applies high voltage pulses (e.g. 5 kV) between embedded electrodes 24 and metal base plate 20 at a high repetition frequency (e.g. 25 kHz). This has the effect that plasma is produced on the surface of enamel layer 22.

The plasma source may be used e.g. for processing gas over the surface of the DBD plasma generation electrode assembly, e.g. to activate a precursor gas for deposition (e.g. for CVD or ALD), to pre-treat a surface prior to PE-CVD, ALD etc. to remove odors, or to generate ozone. A surface to be treated with the generated plasma may be fed over the surface of enamel layer 22, leaving a gap for the plasma. Although a surface DBD plasma source is described by way of example, the combination of metal base plate 20, an enamel layer 22 and electrodes 24 embedded in enamel layer 22 may also be used in plasma sources that could be called volume DBD plasma sources, with an additional electrode with or without a dielectric above the surface of the enamel layer, leaving a volume for the plasma. In one example such a configuration may be used to produce a plasma jet at the end of such a volume, by forcing as flow of gas through the volume with a flow direction in parallel with the surface of enamel layer 22. As noted, electric breakdown of the dielectric layer of the surface DBD plasma generation electrode assembly, i.e. of enamel layer 22 may lead to malfunction, or at least reduced function of the plasma source. Although enamel has various advantages, reduced operational lifetime due electric breakdown is a concern because enamel can have a lower electric breakdown strength than conventional dielectric materials. Some reported nominal values of enamel electric breakdown strength suggest that the electric breakdown strength are below the minimal field strength needed for operation of a surface DBD plasma generation electrode assembly as shown in FIG. 2, which could lead to reduced operational lifetime. However, it has been found that in practice operation is possible using enamel as the dielectric layer with considerable power densities at voltages where no breakdown of the enamel layer occurred.

Operation of electrodes of a plasma source will be described in terms of the voltage Ui at which the plasma ignites and the voltage Uf at which the full area about the high voltage electrode is homogeneously covered with plasma. Furthermore, a plasma source has a maximum voltage that the source can withstand. Obviously, the latter needs to be at least as high as Uf and Ui to realize a useful plasma source.

In an embodiment the thickness of the lower enamel layer below the electrodes was 230 micrometer and the enamel top layer above the lower layer was 130 micrometer. A honeycomb-like high voltage electrode with a diameter of 65-mm may be used and the metal base plate may serve as the ground electrode. In this embodiment an ignition voltage Ui of about 4.3 kV was found in air and the power P depended on the applied voltage U with P=110 W at U=5.4 kV, P=130 W at U=5.75 kV, P=146 W at U=6.0 kV, P=166 W at U=6.25 kV and P=175 W (5.5 W/cm2) at U=6.5 kV. The source withstood voltages of at least U=6.6 kV at P=186 W and 130 C. Uf was 5.4 kV.

When the enamel top layer instead was 260 micrometer thick, the ignition voltage was about 6.1 kV in air and the source withstood voltages of at least U=8.4 kV, this voltage being equal to Uf. When the lower enamel layer below the electrodes was 340 micrometer and the enamel layer above the lower layer was 140 micrometer thick and the same electrode, the ignition voltage was about 4.3 kV in a nitrogen atmosphere and 4.5 kV in air. In the nitrogen atmosphere the power was P=95 W at Uf=6.25 kV, P=106 W at 6.5 kV, P=120 W at 6.75 kV and P=140 W at 7 kV. In air, Uf was 5.87 kV. In an embodiment with a lower enamel layer of 240 micrometer and a 120 micrometer (μm) enamel top layer and an 1×65-mm high voltage electrode a power of 17.3 W (2.66 W/square centimeter) was found at 6.6 kV in air.

With 240 μm bottom and 120 μm top enamel layer and a 1.5 mm wide and 50 cm long embedded electrode the ignition voltage was 3.9 kV and the source withstood voltages of at least 7.9 kV. At 5.8-6.4 kV the system heated to 100-120 C (without cooling) and the power density 2.4 W/cm (120 W). This configuration was tested for 600 hours in open air and $N_2+H_2O$ conditions. At 6.6 kV the system heated to 130 C (without cooling) and power density was 6 W/cm$^2$ or 3.5 W/cm. At 7.0 kV the system heated to 160 C (without cooling) and power density was 4 W/cm or 7 W/cm2. When heated in an oven to 275 C, the system withstood at least 5.7 kV. The power density of plasma generated in nitrogen at such temperature was 2.5 W/cm or about 4.3 W/cm2. With 240 μm bottom and 120 μm top enamel layer, both multilayered, the source withstood voltages of at least 10.2 kV. This means that the dielectric strength of multilayer enamel is larger than 43 kV/mm.

The results may be summarized in the following table.

TABLE

| Dependence of Ui and Uf on the thickness of top of lower enamel layer. | | | |
|---|---|---|---|
| Lower layer thickness μm | Top layer thickness μm | Ui kV | Uf kV |
| 230 | 130 | 4.3 | 5.4 |
| 230 | 260 | 6.1 | 8.4 |
| 340 | 140 | 4.5 | 5.8 |

As can be seen, this shows a trend that the larger the thickness of enamel layers the larger Ui and Uf. Furthermore, a change in Ui and Uf is seen to be influenced to larger extent by a change in the thickness of the top layer than by an equivalent change in the thickness of the lower layer. Already at the thickness of layers 230 μm/130 μm (top/bottom).

From the prior art (JP2004103423) it is known that 0.5-mm-thick enamel withstand 3.8 kV (in argon). In the prior art for higher voltages a different material (quartz glass, alumina) of a larger thickness (1 mm) was required. Surprisingly, the experiments with the present plasma source showed a much higher maximum voltage. With the prior art maximum voltage it would not be expected that even Ui could be reached. In the experiment Ui in air is larger than 4 kV.

In a configuration of 240 μm bottom+140 μm top enamel layer; 1.5 mm wide and 50 cm long embedded HV electrode; metal base plate served as the ground electrode the ignition voltage was about 4.4 kV. At U=6.4 kV & P=100 W, U=7.0 kV & P=131 W, U=7.25 kV & P=150 W, U=7.3 kV & P=160 W, U=7.5 kV & P=165 W, U=7.8 kV & P=194 W, U=8.0 kV & P=212 W.

In a configuration with 240 μm bottom+~120-130 μm top enamel layer and a 1.5 mm wide and 50 cm long embedded HV electrode the ignition voltage was Ui=4.4 kV, and power P=83 W at U=6.3 kV. After 15 heating cycles (1 heating cycle—from 20 C to 150 C within ~5 min followed by cooling down in ambient lab conditions) Ui=4.1-4.25 kV and U=6.2 kV & P=100 W, U=6.6 kV & P=134 W, U=7.0 kV & P=180 W.

In a volume dielectric barrier discharge configuration the electrode assembly with 240 μm bottom and 120 μm top enamel layer carried 1.5 mm wide and 50 cm long embedded HV electrode; and a bare metal plate at 0.5-1.0 mm distance served as the ground electrode. At room temperature and in an $N_2$ atmosphere the ignition voltage was 3.1 kV and the system worked up to at least 7 kV, where it delivered more than twice the required power.

In a similar configuration and conditions but with 140 μm top enamel layer the ignition voltage was 3.4 kV and the system worked up to at least 7.3 kV where it delivered more than twice required power. At 100 C and 9 SLPM of $N_2$ Ui was 1.9 kV, and the system worked up to at least 3.3 kV. With D=0.5-1 mm Ui was about 4.7 kV, and the system worked up to at least U=5 kV at P=125 W. At U=4.75 kV the power was P=100 W and at U=4.8 kV P=110 W.

At 110 C and D=0-0.5 mm Ui was 1.9 kV, the system worked up to at least U=3.3 kV at P=50 W. With D=0.5-1 mm; the system worked up to at least 4.5 kV with Ui about 2.7 kV. At U=4.25 kV P=75 W, U=3.9 kV P=68 W, U=3.63 kV P=60 W and U=3.0 kV & P=45 W. At 140 C and D about 0.5 mm, U=4.5 kV and P=70 W.

An electrode assembly with an enamel layer and a plurality of electrodes embedded in the enamel layer may also be used in a volume dielectric discharge barrier plasma source, i.e. in a plasma source with an air gap between opposite electrodes for generating a high voltage across the air gap. In view of the result for surface DBD sources, an enamel dielectric layer with embedded electrodes may be expected to work also in such a volume DBD source.

The dielectric layer with embedded electrodes may be made by creating the enamel below the embedded electrodes in a first heating step and the enamel above the embedded electrodes in a second heating step, or even both in the same heating step. Although an enamel dielectric that is manufactured in this way may provide for useful power levels below the breakdown voltage, it is desirable to take measures to increase the electric breakdown strength of enamel layer 12 compared to the electric breakdown strength of such a single step enamel layer, and in particular to minimize local defects such as air inclusions, which locally reduce the electric breakdown strength.

Figure 3:
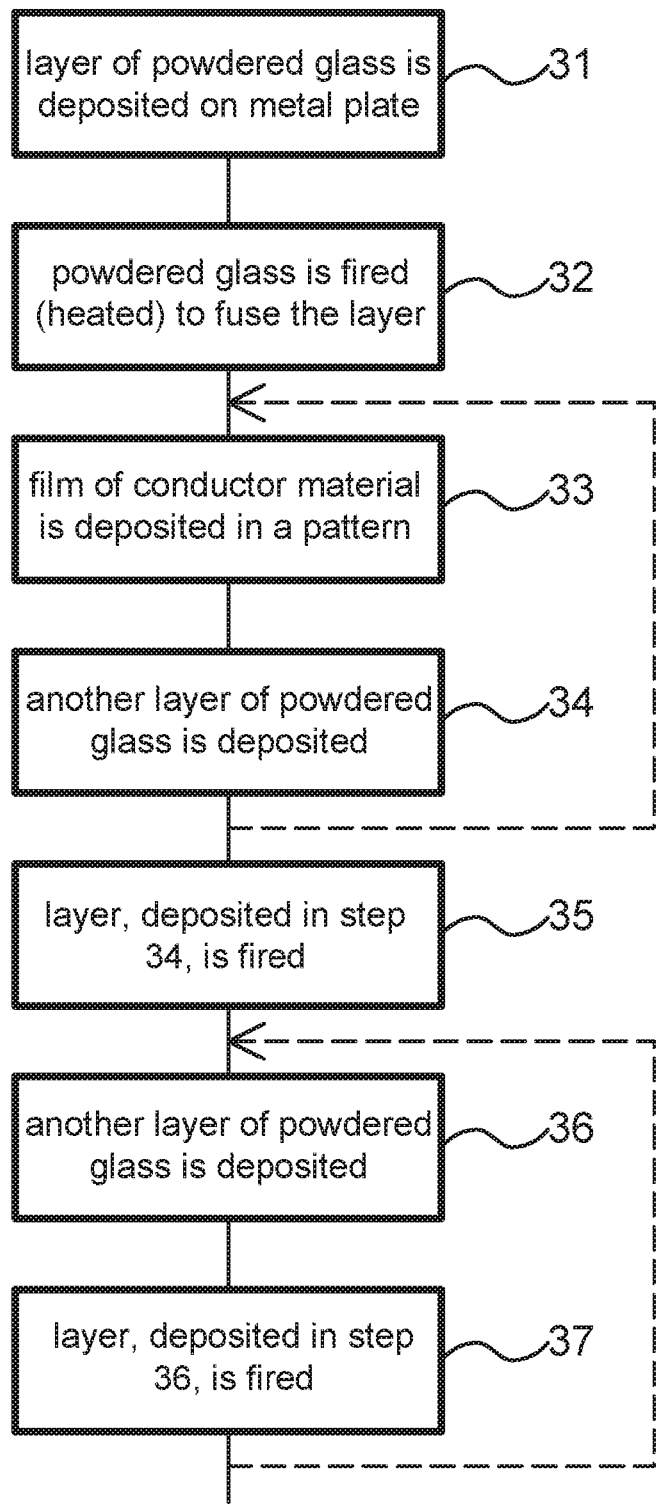
FIG. 3 shows a flow chart of a process of manufacturing a surface DBD plasma generation electrode assembly.

FIG. 3 shows a flow chart of a process of manufacturing a DBD plasma generation electrode assembly as shown in FIG. 1. The process starts from the base metal plate which may be a ferritic stainless steel plate for example.

In a first step 31, a layer of powdered glass is deposited on top of the metal plate, e.g. by spraying. Other methods of depositing the powdered glass may be used, such as spraying, doctor blading, screen printing etc. In an embodiment the layer of powdered glass is deposited only on the top surface. The powdered glass may be supplied mixed with a solvent, which may be water and/or a clay. In a second step 32 the powdered glass is fired (heated) to fuse the layer e.g. at a temperature in a range of 750 to 900 centigrade, and more preferably in a range of 750 to 850 centigrade. This step results in an enamel layer. In an embodiment, the composition of the powdered glass may be adapted to match the thermal expansion coefficients of the base metal plate and the resulting enamel layer to each other. Known composition adaptions that vary thermal expansion coefficient of glass may be used.

First and second step 31, 32 may be repeated a number of times, for example two times, each with a layer of 120 micrometer after firing. Optionally a relatively thin layer may be deposited in a first execution of first and second step 31, 32, followed by thicker layers in subsequent repetitions.

In a third step 33, a film of conductor material is deposited in a pattern that will define the embedded electrodes, i.e a pattern that covers only part of the fused enamel layers for example in the form of elongated parallel strips of conductor material, optionally in a layout pattern comprising electrically connections between the strips. As another example, a honeycomb pattern of strips may be used. A metal such as silver, copper or aluminum may be used as conductor material for example silver. The film of conductor material may be deposited by means of a printing technique for example. The total layer of enamel on which the film of conductor material is deposited may be between 100 and 500 micrometer thick for example, such as 200-300 micrometer.

In a fourth step 34, another layer of powdered glass is deposited on top of the previous layer or layers and the electrodes, followed by firing in a fifth step 35 e.g. to a temperature in a range of 750 to 900 centigrade, and more preferably in a range of 750 to 850 centigrade. This results in an additional enamel layer over the film of conductor material. The layer of powdered glass that is deposited in fourth step 34 may have a thickness of 10 to 50 micrometer after firing and more preferably 20 to 40 micrometer for example. Hence its thickness may be smaller than that of the layer(s) of powdered glass deposited before the film of conductor material.

In a sixth step 36 another layer of powdered glass is deposited on top of the previous layers, followed by firing in a seventh step 37 e.g. to a temperature in a range of 750 to 900 centigrade, and more preferably in a range of 750 to 850 centigrade. This step results in an enamel layer. Sixth step 36 and seventh step 37 may be executed in the same way as fourth step 34 and fifth step 35. Sixth step 36 and seventh step 37 may be repeated a number of times, for example so that three to six layers of enamel are deposited successively over the electrodes.

During the heating in any of second step 32, fourth step 34 and seventh step 37 and their repetitions heating of the powdered glass to the selected temperature suffices, without necessarily heating the entire electrode assembly including the metal plate to that temperature. Similarly, the powdered glass over the entire surface of the metal plate need not be heated to the selected temperature simultaneously. Instead the powdered glass on different parts of the surface may be heated to their maximum temperature successively. There is no need to use an oven wherein the metal plate and the powdered glass are heated uniformly. But of course the metal plate may heat up in any case when the powdered glass is heated. Preferably, the powdered glass on all parts is heated to the same maximum temperature in the range of 750 to 900 centigrade, but instead the maximum temperatures reached on different parts of the surface may be different temperatures in said range.

In the illustrated embodiment the layers of enamel have the same thickness everywhere. But this is not necessary. In other embodiments, one or more layers of enamel with a position dependent thickness may be applied, or a layer may be omitted on part of the surface, e.g. by means of masking. For example, different thicknesses may be used over different parts of the electrodes in order to steer gas flow over the electrode assembly during use as a plasma source. This allows for using the electrode assembly as an aerodynamic plasma actuator. In the illustrated embodiment the layers of enamel have the same composition. But this is not necessary. In other embodiments, there may be a difference between the compositions of different enamel layers. For example the topmost enamel layer, or layers, may have a composition that provides for a higher chemical resistance to a specific plasma than the composition of the lower layers.

After sixth step 36 and seventh step 37 and their optional repetitions, the surface DBD plasma generation electrode assembly is ready for use to generate plasma. The resulting layer of enamel over the film of conductor material that has been deposited when the electrode assembly is ready for use may be between 100 and 200 micrometer thick for example, such as 100-140 micrometer.

Thus, the use of thinner layers increases the operational lifetime of the plasma source and/or the range of plasma conditions that can be tolerated. As the operational lifetime and condition tolerance are affected mostly by the part of the dielectric enamel layer above the level of the embedded electrodes, at least this part is preferably manufactured in small steps.

In another embodiment, sixth step 36 and seventh step 37 may be omitted and fourth step 34 and fifth step 35 may be used to create the entire top layer of 100 micrometer or more. However, in this case the expected operational lifetime and/or condition tolerance of the plasma source are reduced compared to use of sixth step 36 and seventh step 37 and their optional repetitions. The reduced thickness of the layers of powdered glass that are fused in individual executions of fifth step 35 and seventh step 37 reduces the amount of inclusions in the enamel layer, with the effect that the breakdown field strength is increased, or at least that the probability of breakdown is reduced.

The thickness of the layers of powdered glass deposited in successive individual executions of fourth step 34 and sixth step 36 need not be the same. In an embodiment the thickness of the last layer may be smaller than that of a previous layer deposited in an execution of sixth step 36. This reduces manufacturing time while keeping a longer operational lifetime and/or larger condition tolerance, because the quality of the enamel near the surface has the largest effect on operational lifetime and/or condition tolerance. Similarly, the compositions of the enamel in the layers need not be the same.

The part of the dielectric enamel layer below the level of the embedded electrodes may be manufactured in larger steps, as this part of the enamel is less critical for the operational lifetime and/or condition tolerance. In an embodiment a single step may be used wherein the entire part of the enamel layer between the level of the embedded electrode and the base metal plate is deposited. Use of larger thickness in one or more steps decreases manufacturing costs. In contrast, layers of smaller thickness may be used above the electrodes, especially near the surface. Thus at least part of the layer or layers deposited in sixth and seventh steps 36, 27, and preferably all, have a thickness that is smaller than the average thickness of the layer(s) deposited first and second steps 31, 32, and preferably is smaller than the thickness of all these layer(s).

The first enamel thickness between the level of embedded electrodes and the base metal plate is larger than a second enamel thickness from the level of embedded electrodes to the exposed surface of the enamel layer. This is selected because the second thickness must be kept small to ensure a sufficiently strong electric field at its surface. As illustrated in the previous examples, it has been found that a 120 micrometer second thickness results in a plasma ignition voltage between 4-4.5 kV in open air at atmospheric pressure and room temperature, and full plasma coverage of the surface at 5.5-6.5 kV at the same conditions, i.e. the lowest voltage for industrial operation, which is below the breakdown voltage of at least 7.9 kV in open air at atmospheric pressure and temperature of 160 degree centigrade that has been found for the enamel layer. Under such conditions, no breakdown was observed.

When breakdown occurs, this often results only in superficial damage of the surface of the enamel. Pits may arise in the surface that locally obstructs operation. This reduces functionality. The use of enamel makes it possible to repair such defect in the surface by filling the defect with powdered glass of the same composition with which the enamel layer was originally formed and heating to a temperature where the powdered glass flows, i.e. where its viscosity is so low that the surface will be recovered. It has been found that this reproduces the original quality of the enamel for the purpose of plasma generation.

In an embodiment, a defect in an electrode may be repaired as well by depositing electrode material before filling the defect with glass powder, when the defect in the enamel layer has laid bare the electrode and the electrode is damaged.

The invention claimed is:

1. An electrode assembly for use in a dielectric barrier discharge plasma source, the electrode assembly comprising a base metal plate;

an enamel layer on a surface of the base metal plate;

embedded electrodes embedded in the enamel layer, wherein the embedded electrodes lie between the base metal plate and a part of the enamel layer made of enamel obtained by successively depositing a plurality of layers of powdered glass on top of each other and fusing each one of the plurality of second layers of powdered glass by heating before depositing a next one of the second layers of powdered glass.

2. An electrode assembly according to claim 1, wherein the base metal plate forms a wall of a cylinder and the enamel layer with the embedded electrodes lie on a radially outward surface of the wall extending over the circumference of the cylinder.

3. An electrode assembly according to claim 2, wherein a circumference of the cylinder and/or its axial length is at least one meter, the enamel layer with the embedded electrodes extending over the axial length.

4. An electrode assembly according to claim 1, wherein the enamel layer has a thickness of less than one millimeter.

5. The electrode assembly of claim 1, wherein the electrode assembly has a breakdown voltage of 4.8 kV or more.

6. A dielectric barrier discharge plasma source comprising the electrode assembly according to claim 1.

7. A method of manufacturing an electrode assembly for use in a dielectric barrier discharge plasma source, the method comprising depositing a first layer of powdered glass over a surface of base metal plate;

fusing the powdered glass in the first layer by heating;

providing a pattern of electrode material over the powdered glass of the first layer after said fusing;

depositing a second layer of powdered glass over the first layer and the pattern of electrode material;

fusing the powdered glass in the second layer by heating;

successively depositing a plurality of second layers of powdered glass on top of each other over the first layer and the pattern of electrode material, and fusing each one of the plurality of second layers of powdered glass by heating before depositing a next one of the second layers of powdered glass.

8. A method according to claim 7, comprising successively depositing a plurality of first layers of powdered glass over the surface of base metal plate and fusing each one of the plurality of first layers of powdered glass by heating before depositing a next one of the first layers of powdered glass.

9. A method according to claim 7, wherein the pattern of electrode material lie abutting to the powdered glass in the first layer, the first layer having a thickness that is larger than thicknesses of at least part of the layers in said plurality of second layers.

10. A method according to claim 7, wherein a combined thickness of the plurality of second layers is at least a hundred micrometers after fusing.

11. A method according to claim 7, wherein at least a topmost one of the plurality of second layers has a thickness in a range of ten to fifty micrometers after fusing.

12. A method according to claim 11, wherein said thickness lies in a range of twenty to forty micrometers.

13. A method according to claim 7, wherein each of the plurality of second layers has a thickness in a range often to fifty micrometers after fusing.

* * * * *